United States Patent [19]
Steinmeyer et al.

[11] Patent Number: 5,913,888
[45] Date of Patent: Jun. 22, 1999

[54] ANTENNA DEVICE HAVING AT LEAST ONE COOLED ANTENNA

[75] Inventors: Florian Steinmeyer, Herzogenaurach; Markus Vester, Erlangen, both of Germany

[73] Assignee: Siemens Aktiengesellschaft, Munich, Germany

[21] Appl. No.: 08/976,160

[22] Filed: Nov. 21, 1997

[30] Foreign Application Priority Data

Oct. 22, 1996 [DE] Germany ............................ 196 48 253

[51] Int. Cl.$^6$ .................................................. F25B 19/00
[52] U.S. Cl. ........................................... 62/51.1; 62/259.2
[58] Field of Search .................... 62/51.1, 259.2

[56] References Cited

U.S. PATENT DOCUMENTS

| | | | |
|---|---|---|---|
| 4,571,954 | 2/1986 | Roberts et al. | 62/51.1 |
| 4,791,371 | 12/1988 | Krol | 324/318 |
| 5,052,183 | 10/1991 | Koscica et al. | 62/51.1 |
| 5,335,505 | 8/1994 | Ohtani et al. | 62/6 |
| 5,417,073 | 5/1995 | James et al. | 62/51.1 |

FOREIGN PATENT DOCUMENTS

| | | |
|---|---|---|
| 717 245 | 6/1996 | European Pat. Off. . |
| 34 29 386 | 2/1986 | Germany . |
| 37 37 133 | 5/1989 | Germany . |
| 40 13 111 | 10/1991 | Germany . |
| 42 18 635 | 12/1993 | Germany . |

OTHER PUBLICATIONS

R. D. Black et al., "A High–Temperature Superconducting Receiver for Nuclear Magnetic Resonance Microscopy", Science, vol. 259, Feb. 5, 1993, pp. 793–795.

G. M. Daalmans, "HTS DC Squids for Practical Applications", Applied Superconuctivity. vol. 3, Nos. 7–10, 1995, pp. 399–423.

R. S. Withers et al., "Thin–Film HTS Probe Coils for Magnetic–Resonance Imaging", IEEE Transactions on Applied Superconductivity, vol. 3, No. 1, Mar. 1993, 2450–53.

Y. Matsubara et al., "Multi–Stage Pulse Tube Refrigerator for Temperatures below 4K", Crycoolers 8, Plenum Press, New York, 1995, pp. 345–410.

R. Radebaugh, "A Review of Pulse Tube Refrigeration", Advances in Cryogenic Engineering, vol. 35, Plenum Press, New York, 1990, pp. 1191–1205.

J. C. Boissin, "Cryopumps for Plasma Exhaust of Fusion Reactors", Cryogenics, vol. 30, Sep. 1990, pp. 514–520.

J. Fröhlingsdorf, G. Thummes, C. Heiden, "Pulse Pipe Cooling Apparatus: New Refrigerating Machines for Superconductor Technology and Cryoelectronics", VDI Technologiezentrum Physikalische Technologien [VDI Technology Center Physical Technologies], Düsseldorf, Germany, No. 6, Feb. 1996, 4 pages.

*Primary Examiner*—Ronald Capossela
*Attorney, Agent, or Firm*—Kenyon & Kenyon

[57] ABSTRACT

Within a cryostat housing (17), an antenna device (7) having an antenna (16) to be cooled by a cryogenic medium (M). The cryostat housing includes a cold head (15) of a pulse tube cooler, whose cold part (20), which is at a low temperature (TT), is thermally coupled to the antenna (16). The coupling can take place via a dielectric thermal contact member (27).

13 Claims, 6 Drawing Sheets

ANTENNA DEVICE HAVING AT LEAST ONE COOLED ANTENNA

FIELD OF THE INVENTION

The present invention relates to an antenna device for detecting an external electromagnetic field or corresponding field gradients, having at least one cooled antenna. The antenna is disposed within a cryostat housing, which is composed, at least in the area of the antenna, of a material that does not hinder field detection, and is to be retained using a working medium at a cryogenic operating temperature.

BACKGROUND OF THE INVENTION

A cooled antenna device is described in *Science*, vol. 59, Feb. 5, 1993, pp. 793–795. Cooled antennas of normal-conducting material, such as copper, or superconducting material, particularly having an elevated superconductive (or transition) temperature $T_c$ of over 77 K, are distinguished over conventional copper antennas, which work at room temperature, by negligible inherent noise. Thus, they are intended for applications where the overall noise, which is generated by the noise from a transmitter, the antenna, and from an amplifier, is dominated by the antenna noise.

An example in the field of diagnostic medicine is the use of cooled antennas for detecting biomagnetic fields or field gradients, produced, for example, by the brain or the heart. Generally, a superconducting flux antenna is used for this purpose, which has associated superconducting electronics with SQUIDs (see, e.g., *Applied Superconductivity*, 1995, vol. 3, no. 7–10, pp. 399–423). Cooled antennas, in particular those that are superconducting, are also used in tomography, where the nuclear spin resonance (Nuclear Magnetic Resonance "NMR" or Magnetic Resonance Imaging "MRI") effect is utilized to receive high-frequency signals from the nuclear spin in the tissue of a patient (see, e.g., *IEEE Trans. on Applied Supercond.*, Aug. 1992, vol. 3, no. 1, pp. 2450–2453, German Patent No. 42 18 635, or the text reference from *Science* mentioned above). The antennas to be placed directly on the patient are also often described as surface coils or surface antennas.

The above-mentioned *Science* article describes an antenna device of an NMR microscope, which, inside of a cryostat housing, has a chamber filled with liquid helium. Disposed within this chamber in an area proximate to the wall is an antenna of the high-$T_c$-superconducting material $YBa_2Cu_3O_x$ (YBCO). The cryostat housing is configured to permit a proband (i.e. a test person), at room temperature, to be examined, who is to be positioned as closely as possible to the antenna. All parts in the vicinity of the antenna must be made of materials that have no adverse effect on the HF (high frequency) field to be detected.

An antenna device having an antenna of high-$T_c$-superconducting material located in a chamber filled with liquid nitrogen is also described in U.S. Pat. No. 5,417,073.

Such a cooling technique using a liquid cryogenic medium is relatively expensive and not very desirable, particularly for routine use in a medical clinic, such as in nuclear spin tomography systems.

SUMMARY OF THE INVENTION

An object of the present invention is to provide an antenna device for detecting an external electromagnetic field or corresponding field gradients, having at least one cooled antenna. The antenna device enables the work to be carried out without a liquid cryogenic medium. The cooled antenna, in spite of the required thermal insulation, should be configured as close as possible to the field source producing the magnetic field to be detected or corresponding field gradients.

The above-mentioned object is achieved by disposing within the cryostat housing the cold head of a pulse tube cooler, which comprises a regenerator tube, a pulse tube, a cold part at a low temperature having at least one overflow passage between the regenerator tube and the pulse tube, as well as supply lines for the working medium connected to the regenerator tube and the pulse tube. The cold part should be thermally coupled to the antenna.

The advantages associated with the aforementioned exemplary embodiment of the present invention can be seen, in particular, in that the cold heads of pulse tube coolers are available as subassemblies, which are relatively small and, therefore, require little space. The antenna, which is cooled directly or indirectly by the cold head, is to be accommodated in the evacuated cryostat housing required for such a cold head of a pulse tube cooler. The antenna device can have a very compact design, it being necessary to ensure that the antenna is configured in the close proximity of the field source to be detected.

DETAILED DESCRIPTION OF THE INVENTION

An antenna device according to the present invention can be any device for detecting an external electromagnetic field or electromagnetic field gradients using at least one antenna to be cooled by a pulse tube cooler. The antenna can be constructed with normal-conducting or, in particular with superconducting material, it being advantageous to use a high $T_c$ superconducting material (HTS material) having a superconductive transition temperature $T_c$ of over 77 K, the boiling temperature point of liquid nitrogen ($LN_2$).

Figure 1:
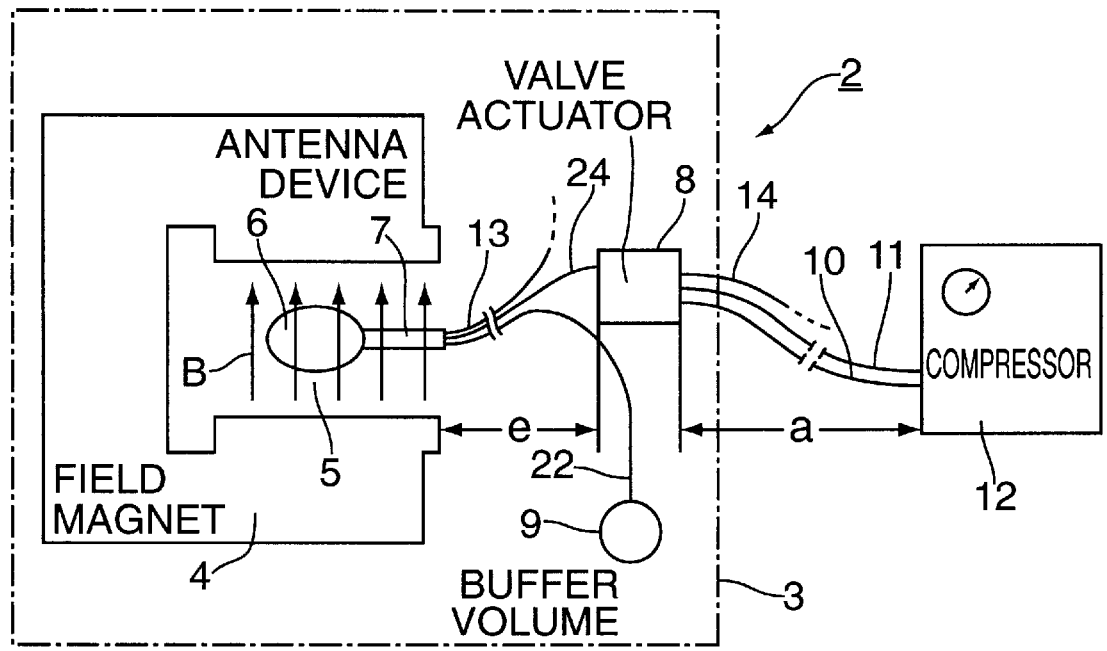
FIG. 1 shows an arrangement of an antenna device according to the present invention in a nuclear spin tomography system.

The antenna device according to the present invention can preferably be used in nuclear spin tomography systems. FIG. 1 shows an exemplary embodiment of parts of the nuclear spin tomography system 2 pertaining to the antenna device. The nuclear spin tomography system 2 has a shielding enclosure 3, in which is arranged a C-shaped basic field magnet 4 (compare to German Patent No. 37 37 133 A). In a working volume 5, the magnet produces a highly homogeneous magnetic field having a magnetic induction B. A proband 6, for example, a patient or the part of the patient's body to be imaged, is to be placed in the magnetic field. Not shown in FIG. 1 are the HF transmitting antenna and gradiometer coils used for nuclear excitation. To detect the HF-signals emanating from certain nuclei, an antenna device 7 is used, which, to this end, is situated directly next to the region of proband 6 to be detected, for example a wrist or a different area of the skin. The antenna is described as a surface antenna or surface coil. The antenna device includes a cold head of a pulse tube cooler, which is coupled via a supply line 24 for a working medium to the pulse tube cooler's valve actuator 8, which in some instances is still situated in enclosure 3. The valve actuator supplies the cold head of the pulse tube cooler periodically, e.g., at a frequency of between 2 and 50 Hz with high pressure and low pressure gas of the working medium, for which helium is selected, for example, and which is more or less at room temperature upon ingress into the cold head. The valve actuator is expediently situated at a larger distance e from the C-magnet, which amounts, for example, to 1 to 4 m. The valve actuator can also be advantageously configured outside of enclosure 3. Flexible connection hoses 10 and 11 for the high pressure and low pressure helium lead from the valve actuator, out of shielding enclosure 3, to the outside, to a compressor 12 of the pulse tube cooler. The compressor is at a distance a, for example about 5 m, from valve actuator 8. Moreover, the cold head of the pulse tube cooler is coupled via an additional, warm supply line 22 to a buffer volume 9 of the working medium. In addition, FIG. 1 shows electrical measuring lines 13, by which the antenna of the antenna device 7 is connected to signal-processing electronics disposed inside or outside of the shielding enclosure 3. Also shown is an electrical line 14 for controlling the valve actuator.

Figure 2:
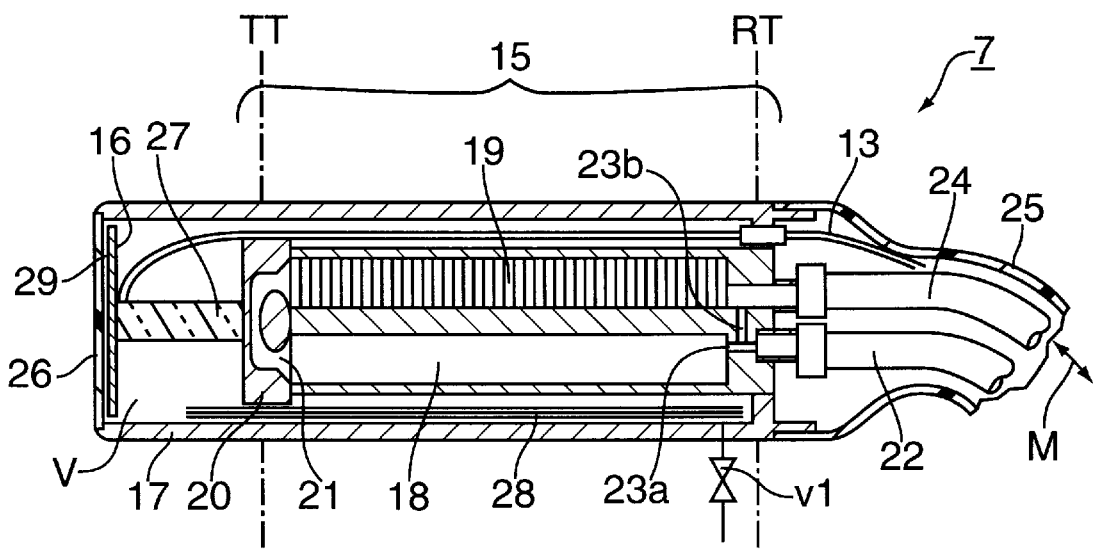
FIG. 2 shows a cross-section of the antenna device.

An exemplary embodiment of the antenna device 7 according to the present invention is shown in greater detail in FIG. 2. The antenna device essentially comprises a conventional pulse tube cooler, with an antenna to be cooled by its cold head. In FIG. 2, the parts relating to the cold head of the pulse tube cooler are designated 15, and those relating to the antenna are designated 16. As far as the pulse tube cooler is concerned, one starts out from known implementations (see, e.g., *Cryocoolers* 8, Plenum Press, New York, 1994, pp. 345–410, *Advances in Cryogenic Engineering*, vol. 35, Plenum Press, New York, 1990, pp. 1191–1205 or *INFO PHYS TECH* of the VDI Technologiezentrum, no. 6/Feb. 1996, entitled *Pulsröhrenkühler: Neue Kältemaschinen für die Supraleitertechnik und Kryoelektronik* ["Pulse Tube Coolers: New Cooling Machines for Superconducting Engineering and Cryoelectronics"], 4 pages). The cold head 15 is situated within a cryostat housing 17 evacuated to an insulating vacuum V at an evacuation valve v1. The cold head 15 has a pulse tube 18 and a regenerator tube 19 disposed parallel thereto. The two parts 18 and 19 (which may or may not be tubular) are joined to a flange-type cold part 20 by an overflow passage 21. A first supply line 24 is used to supply a working medium M, for example He gas, that is generally not cooled and, specifically, is at room temperature RT, pulsating under high pressure with a frequency of between 2 Hz and 50 Hz, to the regenerator tube 19. During the low pressure phase of the valve actuating mechanism of the pulse tube cooler, working gas is also discharged via the supply line 24. At its room-temperature-side end, pulse tube 18 is joined via a connecting duct 23a to a second supply line 22, which, depending on the configuration of the pulse tube cooler leads to a reservoir volume of the working medium or to a buffer volume of, for example, a few liters. The two supply lines 22 and 24 can be located within a shared jacket tube 25. When flowing through overflow passage 21, the working gas cooled in regenerator tube 19 maintains cold part 20 of cold head 15, in the manner of a heat exchanger, at its cryogenic operating temperature, designated low temperature TT. Furthermore, branching off from connecting duct 23a is another connecting duct 23b, which leads to the connection between the first connecting line 24 and regenerator tube 19. At least one of ducts 23a and 23b can be designed as an adjustable valve or as a capillary valve. Both ducts are generally needed to ensure proper operation of cold head 15 and, thus, of the entire pulse tube cooler.

The cryostat housing 17, which is substantially hand-sized, for example, is provided at its front end, facing cold part 20, with a HF-permeable window 26. The window is composed of a material having a small dielectric dissipation factor, for example, sapphire, AlN—, BeO—, $Al_2O_3$-ceramic, or a plastic, such as polystyrene or polysulphone. The cold antenna 16 is disposed behind the window 26, while maintaining an advantageously small gap 29, in the insulating vacuum V of the cryostat housing 17. The antenna can be, for example, a thin film of HTS material on a ceramic, in particular a monocrystalline substrate, or it can be a metallic antenna. Only the substrate upon which the conductor configuration is situated is shown. The antenna is thermally coupled via a dielectric thermal (i.e. heat-conducting) contact member 27 to the optionally metallic, cold flange of cold part 20. To avoid disturbances of the HF field, the thermal contact member can advantageously be made of non-metallic materials, such as sapphire, AlN—, BeO— or $Al_2O_3$-ceramic. If cold part 20 is comprised only of non-metallic parts, such as plastics, which are perhaps fiber-reinforced, or ceramic, then antenna 16 can also be mounted directly on the cold part. The length of the dielectric thermal contact member is so selected that, given efficient cooling, a smallest possible back coupling of metallic parts to antenna 16 occurs. Cryostat housing 17 is also made, at least in the vicinity of the antenna, of only non-metallic parts, such as of plastics.

Also shown in FIG. 2 are an electric measuring line 13 leading to antenna 16, as well as a super insulation 28 for thermally insulating the cold pulse tube cooler from the warm housing wall of cryostat housing 17.

A pulse tube cooler suitable for an antenna device according to the present invention can have any of the usual configurations, e.g., it can work in accordance with the principle of the "double inlet" with a reservoir coupled thereto (see *Cryogenics,* 1990, vol. 30, pp. 514–520). A pulse tube cooler of this kind is assumed in accordance with FIG. 2. However, pulse tube coolers in accordance with the four-valve method can also be used (see, e.g., U.S. Pat. No. 5,335,505). Pulse tube 18 and regenerator tube 19 can have a parallel, or also coaxial design. Both single-stage, as well as multi-stage implementations are possible. On the side of the cold head 15 opposite from antenna 16 is situated a connecting line 24 for the periodic supply with high pressure helium gas and low pressure helium gas. The use of another line 22 is advantageous. When using a "double inlet" cooler, the line 22 leads to a reservoir volume not shown in FIG. 2, i.e., it, itself, contains the necessary reservoir volume for the working medium. When using a four-valve pulse tube cooler, the other line 22 is supplied, as is the first, with helium high pressure gas and with low pressure gas.

In an especially low-noise specific exemplary embodiment of an antenna device according to the present invention, a preamplifier for the signals detected by antenna 16 is also situated inside the cryostat housing 17, e.g., at the flange constituting the cold part 20.

A number of advantages that are significant, particularly in a nuclear spin tomography system, are attained with the embodiment of the antenna device according to the present invention and will now be discussed.

First, at least the cold head of a pulse tube cooler can be composed of non-magnetic metals, such as brass, bronze, copper, titanium alloys, or even completely of dielectrics, such as plastics, ceramic and sapphire, so that no significant distortion of the highly homogeneous basic field of an MRI magnet can occur.

Furthermore, due to the absence of mechanical moving parts and the corresponding low vibration level of the cold head of a pulse tube cooler, no disturbing eddy (Fourcault) currents are induced. If one only uses dielectrics to construct the cold head, then there is also no disturbing distortion of the electric HF field.

A pulse tube cooler with a high enough cooling capacity, which at 77 K can amount to a few watts, and the high vacuum insulation present in the cryostat housing, make it possible for the cold antenna surface to be brought up to the object to be examined with a clearance of only a few millimeters.

In comparison to nitrogen cooling, it is advantageous that even single-stage pulse tube coolers still produce significant cooling capacity even below 77 K, so that, e.g., an operation at 40 to 60 K is possible. In HTS conductors, such as $YBa_2Cu_3O_x$ films having a transition temperature $T_c$ of about 90 K, the critical current density can be increased. Moreover, the HF surface resistance drops, and the noise of magnetic flux threads, which have penetrated into the superconductor, within the magnet's strong basic field, is lowered due to the stronger flux anchoring.

Moreover, a stochastic frequency modulation, which could be caused by boiling bubbles in an operation with liquid nitrogen and, thus, would produce additional disturbances, does not occur when cooling with a pulse tube cooler.

Also, the antenna device of the present invention is user-friendly because medical technical personnel can use such a unit without having to handle cryo-fluids. All the cold components are well insulated and the unit can be turned on by pushing a button.

Pulse tube coolers contain mechanical parts that are less complex than those of Gifford McMahon refrigerators, for example, and can be less expensive. Also, no reinforcement supplemental supplying of $LN_n$ is necessary, and the electrical power consumption can amount to only about 1 kW.

Figure 3:
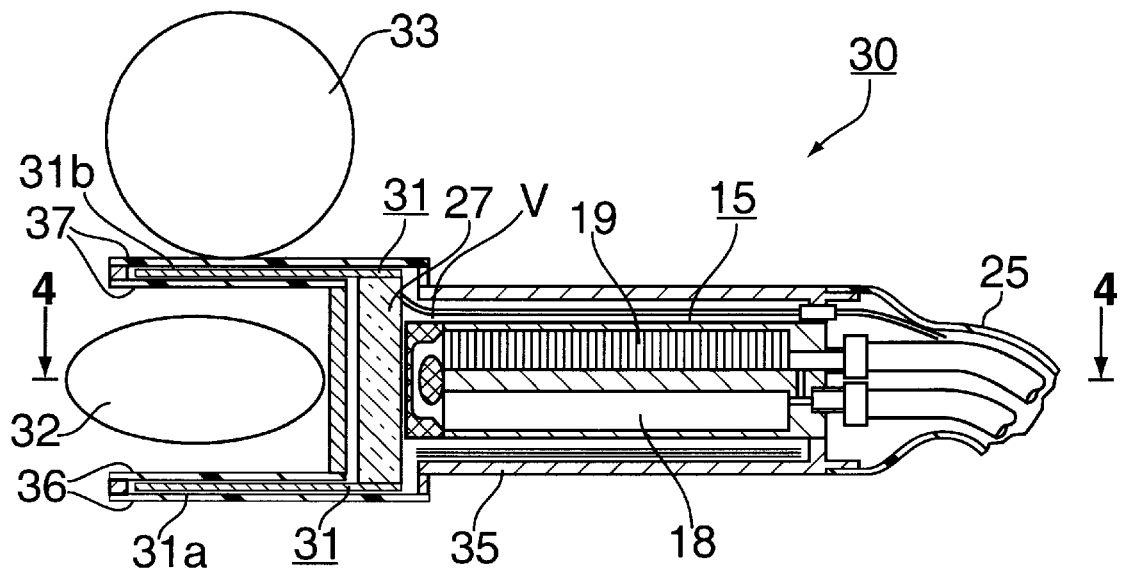
FIG. 3 shows another exemplary embodiment of an antenna device.
Figure 4:
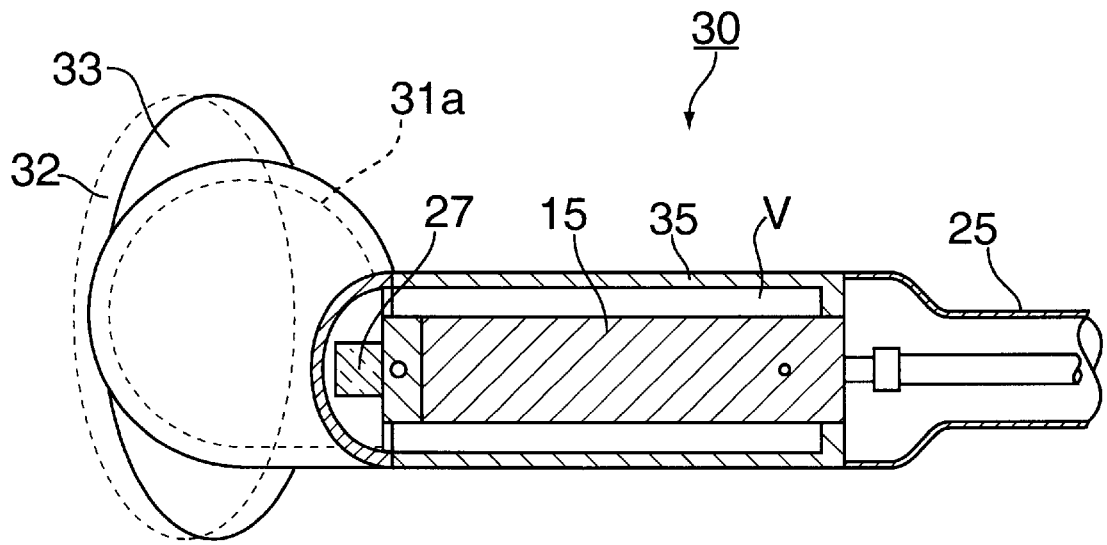
FIG. 4 shows yet another specific embodiment of an antenna device.

In a slight modification of the specific exemplary embodiment of the antenna 16 shown in FIG. 2, the antenna can also be comprised of a plurality of secondary antennas. FIGS. 3 and 4 show an antenna device 30 according to the present invention having this kind of antenna 31. The antenna includes, for example, two secondary antennas 31a and 31b, which are disposed opposite one another in a Helmholtz configuration. This allows parts 32 of a patient's body, such as wrists, to be examined as probands between the two secondary antennas, and with an especially high resolution, given a homogeneous HF sensitivity distribution. In addition, it is possible at the same time to examine larger body parts 33 on the outside of antenna 31. At least the part of a cryostat housing 35 surrounding the secondary antennas 31a and 31b must also be constructed as a HF-permeable window 36 and 37.

FIG. 4 shows a section through antenna device 30 of FIG. 3 along a line of intersection denoted by IV—IV.

Figure 5:
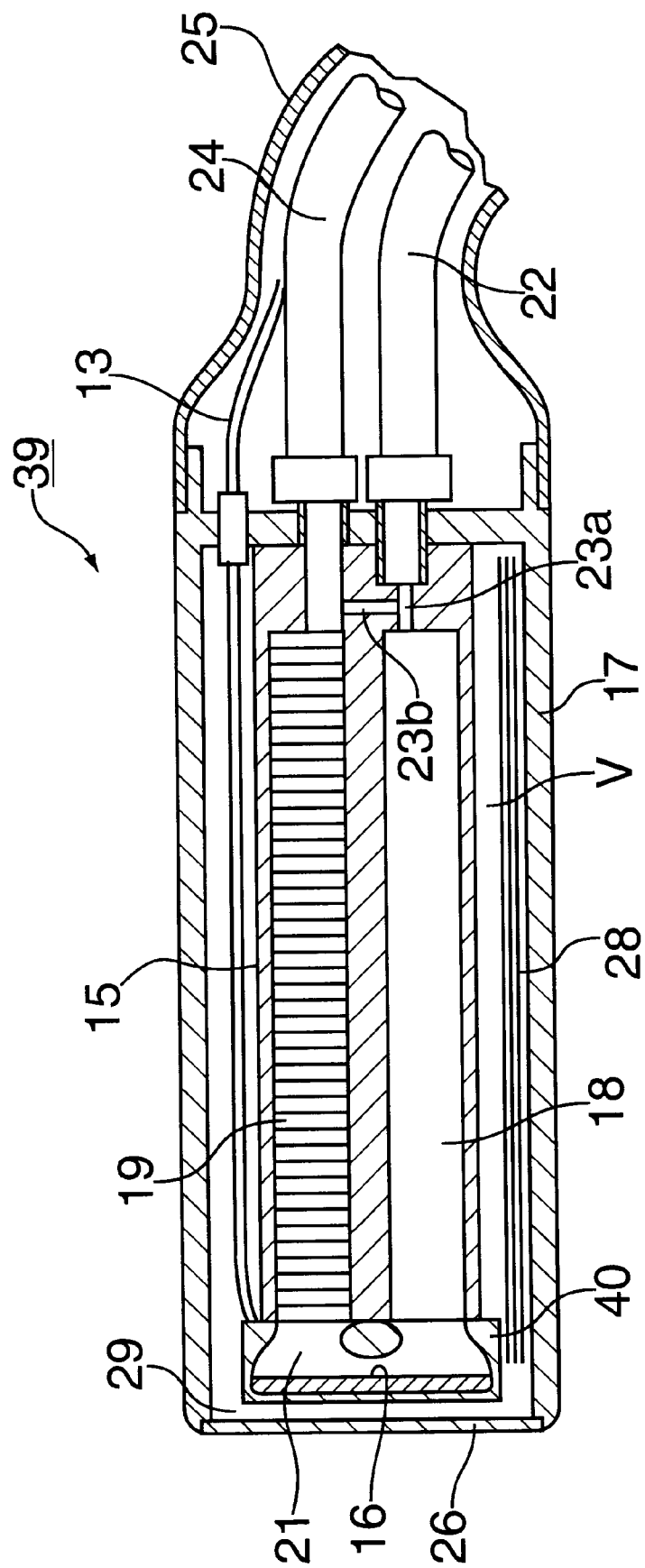
FIG. 5 shows an exemplary embodiment of an antenna device according to the present invention.

When at least the cold part of a pulse tube cooler's cold head is composed of a dielectric material, the antenna can also be integrated in the cold part itself. FIG. 5 shows such an embodiment of an antenna device 39. The antenna device has a cold head 15 of a pulse tube cooler, includes a cold part 40, e.g., of a ceramic material, in whose overflow passage 21 for the cryogenic medium is disposed the antenna 16.

Figure 6:
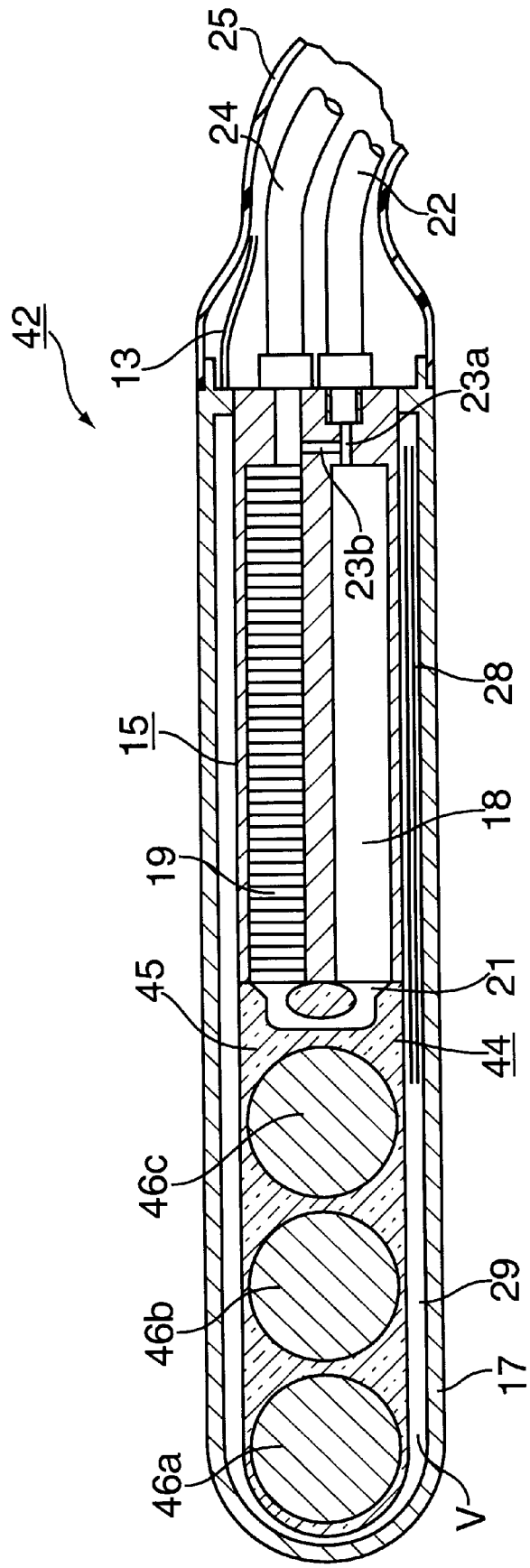
FIG. 6 shows an exemplary embodiment of an antenna device according to the present invention.
Figure 7:
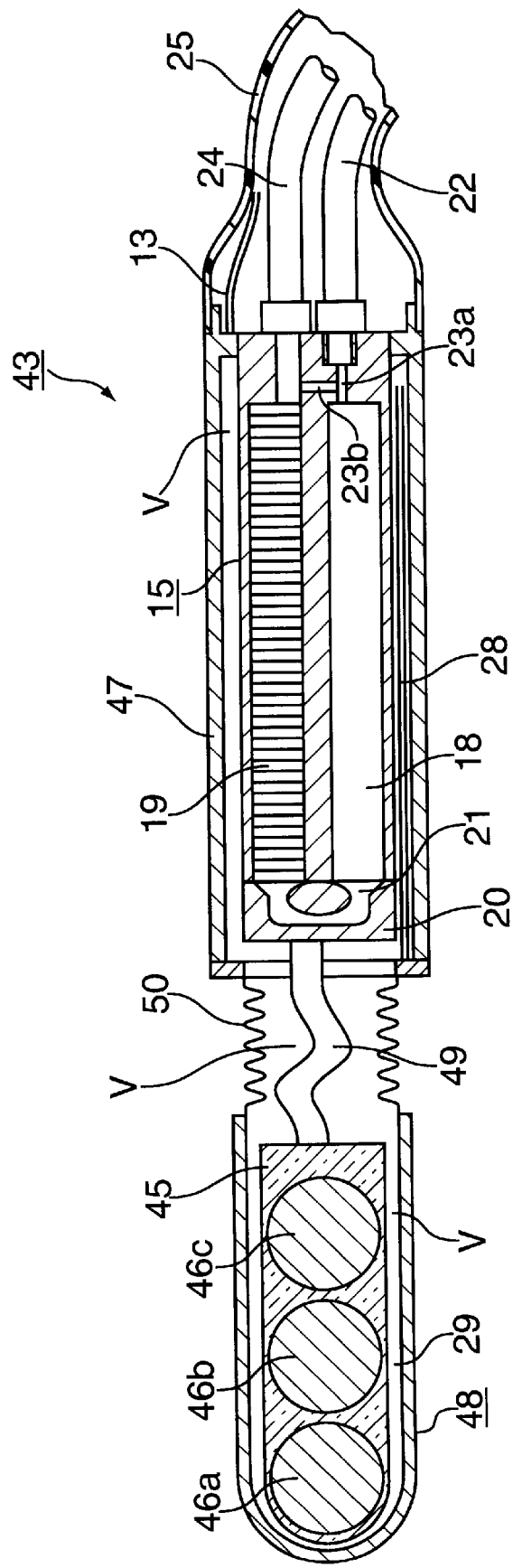
FIG. 7 shows an exemplary embodiment of an antenna device according to the present invention.

When working with a pulse tube cooler's cold head that has a smaller type of construction, it is possible to produce a miniature antenna device suitable, for example, for endoscopic examinations. FIGS. 6 and 7 illustrate two exemplary embodiments of antenna devices 42 and 43, respectively. The antenna devices 42 and 43 can optionally have a plurality of small antennas arranged in an array. In FIG. 6, the pulse tube cooler's cold head 15 is integrated in an endoscope. The cold head's cold part 44 is designed as a large-surface, dielectric thermal contact member 45, which supports a plurality of substrates 46a through 46c for accommodating the antenna loops. In the exemplary embodiment of the antenna device 43 shown in FIG. 7, cold head 15 is spatially separated from an antenna head 48, it being necessary for the antennas illustrated by their substrates 46a through 46c to be indirectly cooled via a flexible thermal contact member 49, e.g., a copper litz wire. The use of a flexible corrugated tube 50 ensures a vacuum-tight connection between the part of a cryostat housing 47 surrounding antenna head 48 and the part of the cryostat housing surrounding cold head 15. Thus, when endoscopic examinations are performed, the pulse tube cooler's cold head can remain extracorporeal.

Figure 8:
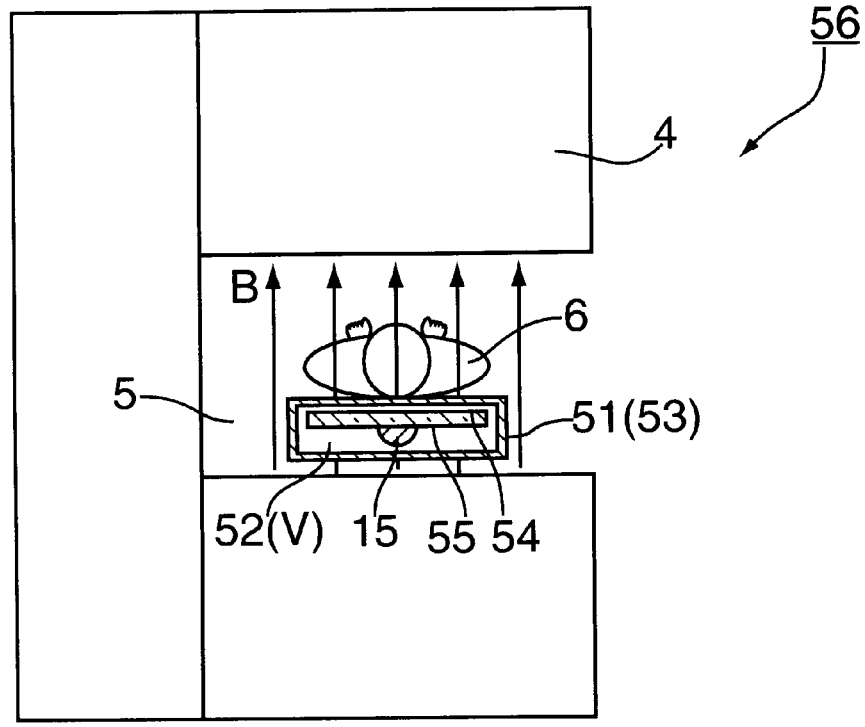
FIG. 8 shows a construction of an antenna device for a magnet for nuclear spin tomography.
Figure 9:
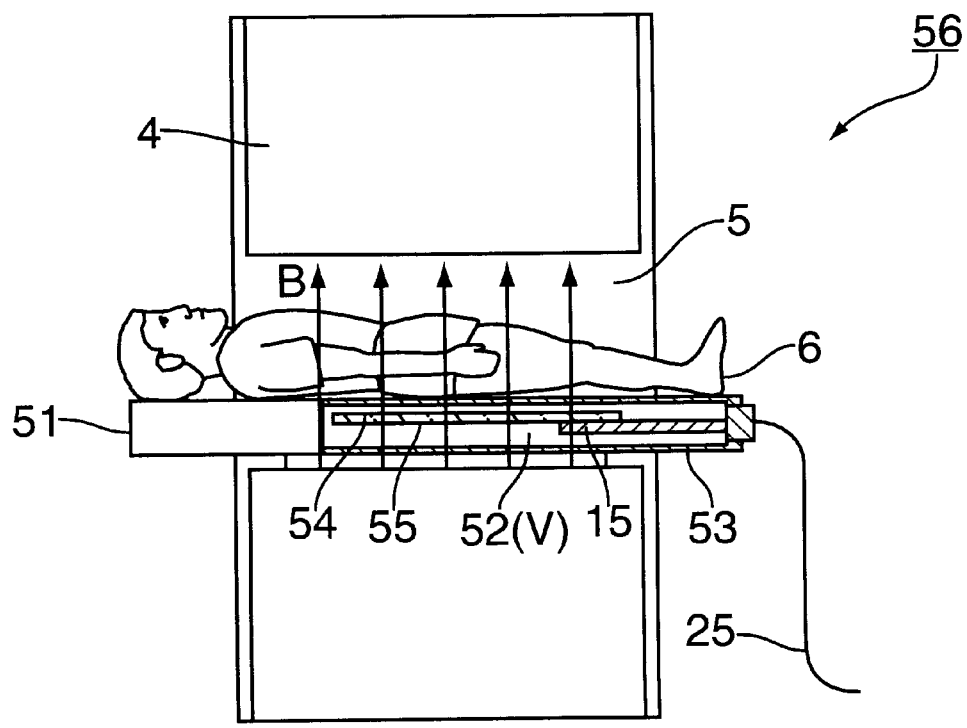
FIG. 9 shows another construction of an antenna device for a magnet for nuclear spin tomography.

To ensure that the HF antennas do not prevent medical personnel from being able to access a patient in a nuclear spin tomography installation having a C-magnet, it can be beneficial for these antennas to be integrated in an examining table. FIGS. 8 and 9 show in cross section and longitudinal section, respectively, an exemplary embodiment of a C-magnet 4 as part of a nuclear spin tomography installation 56 with such an examining table 51. The examining table 51 enables a large-surface antenna or an antenna array to be advantageously integrated in the table. Due to the unfavorable field geometry of such HF antennas, it is especially desirable for the antennas to be cooled, since otherwise the antenna noise would dominate. Therefore, in a vacuum chamber 52 of a part of examining table 51 configured as cryostat housing 53, the present invention makes provision for the cold head 15 of a pulse tube cooler. The thermal coupling to antennas 54 likewise located in vacuum chamber 52 takes place via a thermal contact member 55, which serves the purpose of a thermal busbar and, as a dielectric solid, in particular, can be made, e.g., of saphire, AlN or BeO. Also possible, instead, is a heat transfer using a gas or fluid flow within a self-enclosed housing. This can take the form, e.g., of a possibly flat, "heat pipe", with $N_2$, Ar, Ne, $H_2$, hydrocarbons or with gas mixtures. Also possible in this case is a natural convection, forced circulation of gas, or fluid using pumps.

What is claimed is:

1. An electromagnetic detection antenna device, comprising:

a cryostat housing; and at least one cooled antenna positioned within the cryostat housing, wherein the cryostat housing includes a material that does not hinder field detection, wherein the at least one cooled antenna is retained at a cryogenic operating temperature using a working medium, wherein the cryostat housing includes a cold head of a pulse tube cooler, the pulse tube cooler including a pulse tube, a regenerator tube, a cold part at a low temperature having at least one overflow passage between the regenerator tube and the pulse tube, supply lines for the working medium connected to the regenerator tube and the pulse tube, and wherein the pulse tube cooler is thermally coupled with the cold part to the at least one cooled antenna.

2. The antenna device according to claim 1 comprising at least one thermal contact member for providing a thermal coupling of the antenna to the cold part of the cold head.

3. The antenna device according to claim 2, wherein the thermal contact member is comprised of a dielectric material.

4. The antenna device according to claim 1, wherein the antenna is positioned on or in the cold part and wherein the cold part is comprises a dielectric material.

5. The antenna device according to claim 1, wherein the antenna is contains a superconducting material.

6. The antenna device according to claim 5, wherein the superconducting material has a superconductive transition temperature of over 77 K.

7. The antenna device according to claim 1, wherein the cryostat housing includes a preamplifier, the preamplifier amplifying signals detected by the antenna.

8. The antenna device according to claim 1, wherein a plurality of cooled antennas are thermally coupled to the cold part of the cold head.

9. The antenna device according to claim 8, wherein a plurality of cooled antennas form a Helmholtz configuration.

10. The antenna device according to claim 1, wherein the antenna device is disposed in a nuclear spin tomography system.

11. The antenna device according to claim 10, wherein the antenna device forms a part of a patient examining table.

12. The antenna device according to claim 1, wherein the antenna device forms a part of an endoscopic device.

13. The antenna device according to claim 12, wherein the cryostat housing includes a first part and a second part, wherein the first part accommodates the cold head of the pulse tube cooler and the second part accommodates the antenna, and wherein the first part and the second part are coupled to one another in a vacuum-tight manner by way of a flexible corrugated tube.

* * * * *